(12) United States Patent
Zhang

(10) Patent No.: US 10,566,972 B1
(45) Date of Patent: Feb. 18, 2020

(54) ANALOG SWITCHES IMMUNE TO POWER SEQUENCE

(71) Applicant: Apple Inc., Cupertino, CA (US)

(72) Inventor: Weibiao Zhang, Saratoga, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/373,490

(22) Filed: Apr. 2, 2019

(51) Int. Cl.
| | |
|---|---|
| *H03K 19/0185* | (2006.01) |
| *H03K 5/08* | (2006.01) |
| *H03K 19/00* | (2006.01) |
| *G06F 1/3296* | (2019.01) |
| *G06F 1/324* | (2019.01) |

(52) U.S. Cl.
CPC ......... *H03K 19/0013* (2013.01); *G06F 1/324* (2013.01); *G06F 1/3296* (2013.01); *H03K 5/08* (2013.01); *H03K 19/018521* (2013.01)

(58) Field of Classification Search
CPC ......... H03K 2217/0054; H03K 17/102; H03K 2217/0018; H03K 17/6872; H03K 2217/0036; H03K 17/687; H03K 17/16; H03K 2217/0009; H03K 17/063; H03K 19/003; H03K 19/0013; H03K 19/018521; H03K 17/04; H03K 17/08; H03K 17/08122; H03K 17/08142; H03K 17/0822; H03K 17/145; H03K 17/161; H03K 17/284; H03K 19/00361; H03K 19/018507; H03K 5/084; H03K 19/018571; H03G 3/001; H04B 15/005; H04B 1/44; G06F 1/324; G06F 1/3296
See application file for complete search history.

(56) References Cited

U.S. PATENT DOCUMENTS

| | | | | |
|---|---|---|---|---|
| 5,808,483 A | * | 9/1998 | Sako | H03K 19/1737 326/113 |
| 5,880,620 A | * | 3/1999 | Gitlin | G11C 5/146 327/534 |
| 6,194,952 B1 | * | 2/2001 | Shigehara | H03K 17/165 327/436 |
| 7,030,659 B2 | * | 4/2006 | Graves | H03K 17/063 326/113 |
| 8,049,555 B2 | * | 11/2011 | Arnold | G11C 27/024 323/313 |
| 8,050,086 B2 | | 11/2011 | Shalvi et al. | |
| 8,847,629 B2 | * | 9/2014 | Landoulsi | H03K 17/16 327/91 |

(Continued)

*Primary Examiner* — Vibol Tan
(74) *Attorney, Agent, or Firm* — Meyertons Hood Kivlin Kowert and Goetzel PC; Rory D. Rankin

(57) ABSTRACT

A system and method for efficiently receiving analog input signals. In various embodiments, a functional unit includes a switch in its interface logic. The switch receives an analog input signal, and when enabled, conveys the received input signal as an analog output signal. The switch is enabled when the received enable signal is asserted. However, when the power supply voltage is at a logic low level, an output n-type device is disabled while an output p-type device is enabled. A guard p-type device serially connected with the output p-type device is disabled by other devices used to control the guard p-type device. The control devices also ensure that the body terminals of the guard p-type device and other p-type devices receive a logic high level regardless of the power supply value, which prevents forward bias currents in parasitic diodes of the p-type devices.

20 Claims, 9 Drawing Sheets

(56) References Cited

U.S. PATENT DOCUMENTS

| | | |
|---|---|---|
| 8,904,248 B2 | 12/2014 | Park et al. |
| 8,975,948 B2 * | 3/2015 | Gonzalez Diaz .... H03K 17/162 |
| | | 327/394 |
| 9,035,676 B2 * | 5/2015 | Xu ........................... H04N 5/66 |
| | | 326/63 |
| 9,672,902 B1 * | 6/2017 | Sinangil ................ G11C 11/419 |
| 2018/0062646 A1 * | 3/2018 | Herrera ................... H03F 1/342 |

* cited by examiner

ANALOG SWITCHES IMMUNE TO POWER SEQUENCE

BACKGROUND

Technical Field

Embodiments described herein relate to the field of computing systems and, more particularly, to efficiently receiving analog input signals.

Description of the Related Art

A computing system such as a semiconductor chip includes multiple functional blocks or units, each capable of processing data. In various embodiments, the multiple functional units are individual dies on one of a system on a chip (SOC), a multi-chip module (MCM) or a printed circuit board. Examples of functional units are general-purpose processors with one or more cores in a central processing unit (CPU), highly parallel data architected processors with one or more cores in graphics processing units (GPUs) and digital signal processors (DSPs), display controllers, audio processing components, a camera processing unit, networking components, peripheral interface controllers, memory controllers, and so on.

Control logic, such as a power management unit, within the computing system determines one or more operating states for the different functional units. The operating state includes one or more of a power supply voltage and an operational clock frequency. In addition, the power management unit determines one or more operating modes for the different functional units. The operating modes include a sleep mode where one or more blocks of logic are powered off, an idle mode where one or more blocks of logic have clock enable signals disabled, and one or more active modes, each with a different operating state.

The interfaces of the multiple functional units include multiple switches for receiving messages, transactions and data from other functional units. The switches receive analog signals, and when enabled, convey the received signals to analog and/or digital logic within the functional unit. Typically, the switches include at least two transistors such as a p-type metal oxide semiconductor (PMOS) transistor and an n-type metal oxide semiconductor (NMOS) transistor. The PMOS transistor is also referred to as a p-type device. Similarly, the NMOS transistor is also referred to as an n-type device. In many designs, the devices are field effect transistors (FETs). The use of the two types of devices ensures the digital logic in the functional unit receives either a Boolean logic high value or a Boolean logic low value. Due to the use of the two types of devices, the switches are also referred to as complementary MOS (CMOS) switches.

Due to the fabrication methods of the two types of devices used in CMOS switches, the devices include parasitic diodes. For example, the p-type device includes a p-to-n diode, or PN diode, from a p-type region used as a source or drain terminal to the n-type well used for the body of the device and used to provide the p-type channel between the source and drain terminals when conducting current. When this parasitic diode is forward biased, undesirable current flows through the parasitic diode. The undesirable current increases power consumption. The parasitic diode of the p-type device becomes forward biased when the voltage of either of the source or drain terminal is greater than the voltage of the body terminal.

Due to the changes in the operating modes and the operating states of multiple functional units, at times, the switches receive analog input signals before receiving an updated power supply voltage. Therefore, the switches receive the analog input signals before receiving a higher power supply voltage. When the amplitudes of the received analog input signals are greater than the power supply voltage of the switches, the voltage of either the source or the drain terminal of any p-type devices of the switch is greater than the voltage of the body terminal. Therefore, forward bias currents flow in the parasitic diodes of the p-type devices of the switches. The forward bias currents increase power consumption.

In view of the above, efficient methods and mechanisms for efficiently receiving analog input signals are desired.

SUMMARY

Systems and methods for efficiently receiving analog input signals are contemplated. In various embodiments, a computing system includes multiple functional units and a power management unit. The interfaces of the multiple functional units includes multiple switches for receiving messages, transactions and data from other functional units. The switches receive analog signals, and when enabled, convey the received signals to analog and/or digital logic within the functional unit. The power management unit determines one or more operating states for the different functional units. The operating state includes one or more of a power supply voltage and an operational clock frequency. In addition, the power management unit determines one or more operating modes for the different functional units. The operating modes include a sleep mode where one or more blocks of logic are powered off, an idle mode where one or more blocks of logic have clock enable signals disabled, and one or more active modes, each with a different operating state.

A given switch of the multiple switches receives a power supply signal. As used herein, the power supply signal is also referred to as the power supply voltage, the supply voltage, and the power supply voltage level. The given switch also receives an input signal on a source terminal of an output n-type device, an enable signal on a gate terminal of the output n-type device, and an inverted value of the enable signal on a gate terminal of an output p-type device. The given switch conveys the input signal as an output signal on a drain terminal of each of the output n-type device and the output p-type device when the switch determines the power supply signal has a Boolean logic high level and the enable signal has a Boolean logic high level. In other words, the Boolean logic high level is equivalent to the positive, non-zero power supply voltage level. The Boolean logic high level is also referred to as a logic high level. Similarly, the Boolean logic low level is equivalent to the ground reference voltage level. The Boolean logic low level is also referred to as a logic low level.

Although the logic high level set by the power supply signal is typically the highest level in the given switch, due to the varying operating modes and changes in operating states, at times, the given switch receives an input signal with a voltage amplitude greater than an amplitude of the received power supply signal. In one example, the input signal has a logic high level and the power supply signal still has a logic low level. When the given switch determines the power supply signal has a logic low level, the given switch prevents driving a logic high level or a logic low level on a source terminal of the output p-type device.

To prevent a logic high level or a logic low level being driven on the source terminal of the output p-type device, in various embodiments, the given switch includes a guard p-type device in series with the output p-type device. The guard p-type device receives the input signal on its gate terminal. When the input signal is greater than the threshold voltage of the p-type devices, the guard p-type device is disabled, which prevents driving a logic high level or a logic low level on the source terminal of the output p-type device. Therefore, the parasitic diode of the output p-type device is not forward biased, and no parasitic diode current flows in the output p-type device. To prevent forward biasing of the parasitic diode in the guard p-type device, the given switch includes other devices to ensure the body terminal of the guard p-type device is driven to a logic high level regardless of the voltage levels on the input signal and the power supply signal.

These and other embodiments will be further appreciated upon reference to the following description and drawings.

BRIEF DESCRIPTION OF THE DRAWINGS

The above and further advantages of the methods and mechanisms may be better understood by referring to the following description in conjunction with the accompanying drawings, in which.

Figure 1:
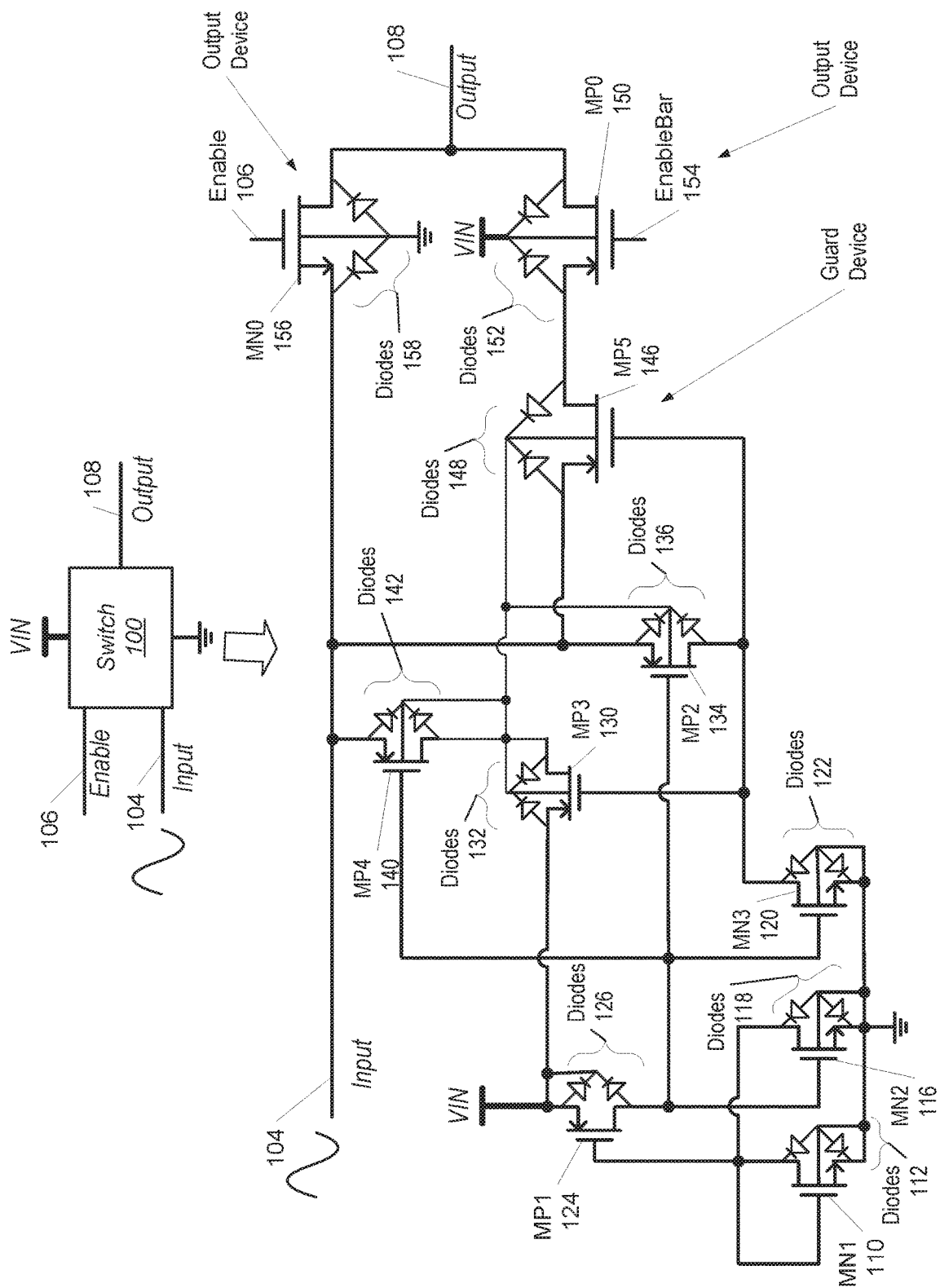
FIG. 1 is a block diagram of one embodiment of an analog input switch.

While the embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112(f) for that unit/circuit/component.

DETAILED DESCRIPTION OF EMBODIMENTS

In the following description, numerous specific details are set forth to provide a thorough understanding of the embodiments described in this disclosure. However, one having ordinary skill in the art should recognize that the embodiments might be practiced without these specific details. In some instances, well-known circuits, structures, and techniques have not been shown in detail for ease of illustration and to avoid obscuring the description of the embodiments.

Turning now to FIG. 1, a block diagram illustrating one embodiment of an analog switch 100 is shown. In various embodiments, the analog switch 100 receives an analog input signal 104, and when enabled, conveys the received input signal 104 as the output signal 108 as an analog signal. The analog switch 100 also receives a power supply voltage (or power supply signal) designated as "VIN" as well as a ground reference voltage level. The power supply voltage VIN is also referred to as the power supply signal VIN or the power supply voltage VIN. In an embodiment, the analog switch 100 (or switch 100) is enabled when the received enable signal 106 is asserted. In some embodiments, the switch 100 uses the transistors 110, 116, 120, 124, 130, 134, 140, 146, 150 and 156 to both provide its functionality and protect against parasitic diode currents.

The switch 100 uses the transistors 156 (MN0) and 150 (MP0) as output circuitry for conveying output signal 108. To convey the input signal 104 to the output circuitry and to protect against parasitic diode currents, the switch 100 uses the transistors 110, 116, 120, 124, 130, 134, 140 and 146 as control circuitry. The transistors in the switch 100 include the internal pairs of diodes 112, 118, 126, 132, 136, 142, 148, 152 and 158. The switch 100 uses transistors such as p-type metal oxide semiconductor (PMOS) transistors and n-type metal oxide semiconductor (NMOS) transistors. In some embodiments, the transistors are field effect transistors (FETs). Transistors are also referred to as devices. Therefore, the PMOS transistor is also referred to as a p-type device. Similarly, the NMOS transistor is also referred to as an n-type device. The use of the two types of devices in the switch 100 ensures the output 108 provides the same analog signal as the input signal without distortion at high and low signal level.

As mentioned, when enabled, the switch 100 conveys the received input signal 104 as the output signal 108. Typically, a signal is considered to be asserted when the signal has a value used to enable logic and turn on transistors to cause the transistor to conduct current. For some logic, an asserted value is a Boolean logic high value or a Boolean logic high level. For example, when an NMOS transistor receives a Boolean logic high level on its gate terminal, the NMOS transistor is enabled, or otherwise turned on, and the NMOS transistor is capable of conducting current. For other logic, an asserted value is a Boolean logic low level. In contrast, when a PMOS transistor receives a Boolean logic low level on its gate terminal, the PMOS transistor is enabled, or otherwise turned on, and the PMOS transistor is capable of conducting current. As described earlier, a Boolean logic high level is also referred to as a logic high level. Similarly, a Boolean logic low level is also referred to as a logic low level.

Due to the fabrication methods of the two types of devices used in the switch 100, the devices 110, 116, 120, 124, 130, 134, 140, 146, 154 and 156 include the internal pairs of parasitic diodes 112, 118, 126, 132, 136, 142, 148, 152 and 158. The p-type device 124 (MP1) has the parasitic pair of diodes 126, the p-type device 134 (MP2) has the parasitic pair of diodes 136, the p-type device 130 (MP3) has the parasitic pair of diodes 132, the p-type device 140 (MP4) has the parasitic pair of diodes 142, the guard p-type device 146 (MP5) has the parasitic pair of diodes 148, and the output p-type device 150 (MP0) has the parasitic pair of diodes 152. Referring to the n-type devices, the n-type device 110 (MN1) has the parasitic pair of diodes 112, the n-type device 116 (MN2) has the parasitic pair of diodes 118, the n-type device 120 (MN3) has the parasitic pair of diodes 122, and the output n-type device 156 (MN0) has the parasitic pair of diodes 158. When any one of the parasitic diodes is forward biased, undesirable current flows through the parasitic diode. The undesirable current increases power consumption.

The parasitic diodes of the p-type devices become forward biased when the voltage of either of the source terminal or the drain terminal is greater than the voltage of the body terminal. The parasitic diodes of the n-type device become forward biased when the voltage of either of the source terminal or the drain terminal is less than the voltage of the body terminal. In order to reduce forward bias currents through the parasitic diodes of the switch 100, the interface logic of functional units (not shown) surrounding the switch 100 should operate the switch 100 within the range of the power rails such as between the ground reference voltage level used to indicate the logic low level and a positive, non-zero power supply voltage used to indicate the logic high level. However, due to the changes in the operating modes and the operating states of multiple functional units, at times, the switch 100 receives the analog input signal 104 before receiving an updated value for VIN.

When the switch 100 receives the analog input signal 104 before receiving an updated value for VIN, the switch 100 is capable of receiving a positive, non-zero voltage greater than a transistor threshold voltage on the source terminal or drain terminal of a p-type device while the power supply VIN remains at a logic low level such as the ground reference voltage level. However, the switch 100 prevents the parasitic diodes of the p-type devices from becoming forward biased despite this scenario occurring. The parasitic diodes of the n-type devices do not become forward biased as long as the minimum voltage used by the switch 100 is the ground reference voltage level.

As shown, the switch 100 uses two output devices such as the output n-type device 156 (MN0) and the output p-type device 150 (MP0). The output n-type device 156 (MN0) is enabled when it receives a logic high level on its gate terminal such as when the enable signal 106 has a logic high level. The output p-type device 150 (MP0) is enabled when it receives a logic low level on its gate terminal such as when the enablebar signal 154 has a logic low level. The guard p-type device 146 (MP5) is connected in series with the output p-type device 150 (MP0).

When the switch 100 receives a logic low level for VIN, the gate terminal of the output p-type device 150 (MP0) receives a logic low level, since each of the signals enable 106 and enablebar 154 is driven to a logic low level while VIN is also driven to a logic low level. For example, an interface for a functional unit using the switch 100 has not yet transitioned VIN to a logic high level. Therefore, the output p-type device 150 (MP0) is enabled. In contrast, the output n-type device 156 (MN0) is disabled since the enable signal 106 is at a logic low level. Additionally, the switch 100 prevents driving a logic high level or a logic low level on the source terminal of the output p-type device 150 (MP0). The switch 100 turns off, or disables, the guard p-type device 146 (MP5) to prevent driving a logic high level or a logic low level on the source terminal of the output p-type device 150 (MP0). Although the body terminal of the output p-type device 150 (MP0) is at a logic low level while VIN is at a logic low level, there is no forward biasing of the pair of diodes 152. Therefore, no parasitic diode current flows in the pair of diodes 152 of the output p-type device 150 (MP0).

Figure 2:
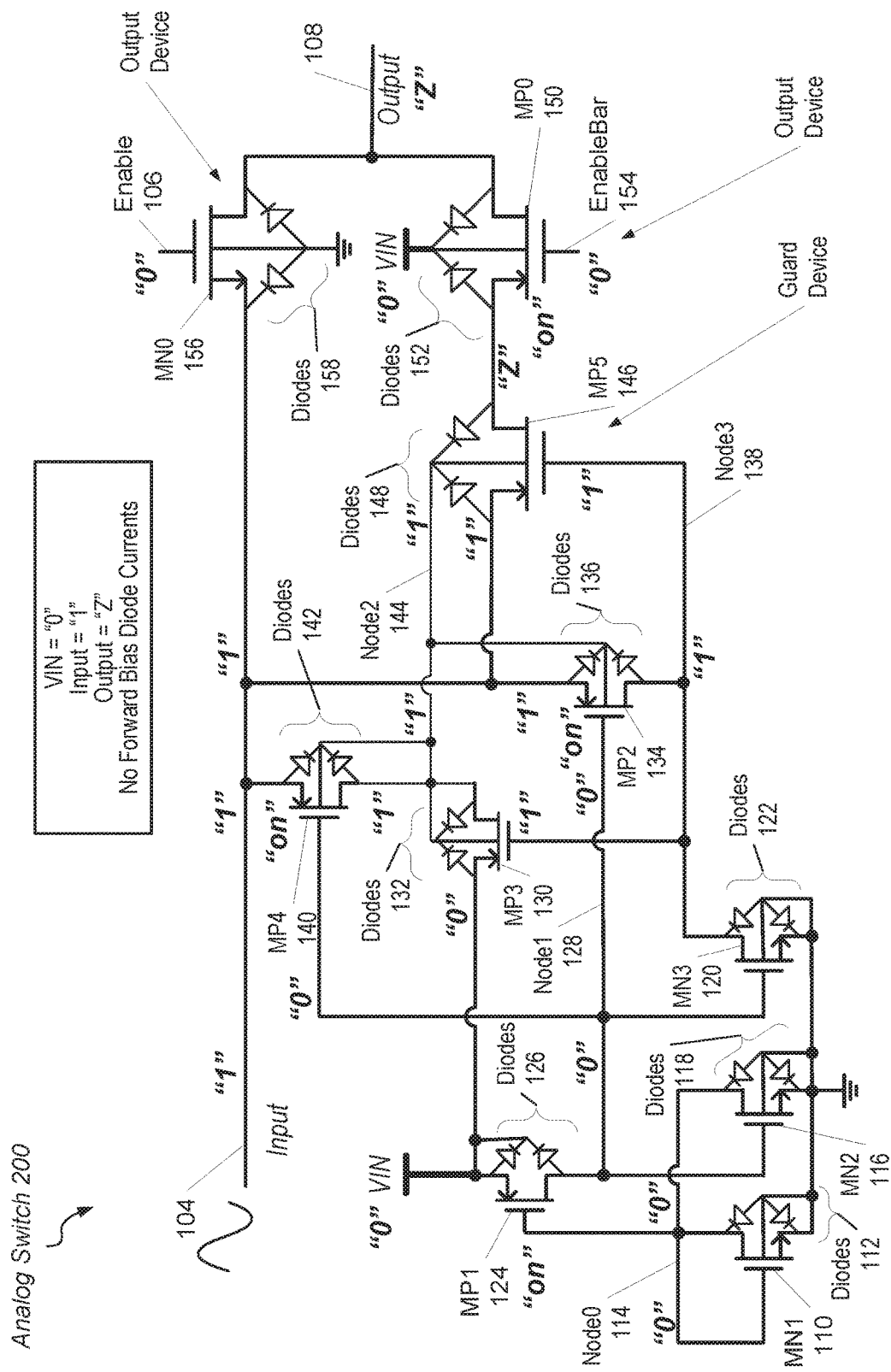
FIG. 2 is a block diagram of one embodiment of an analog input switch.
Figure 3:
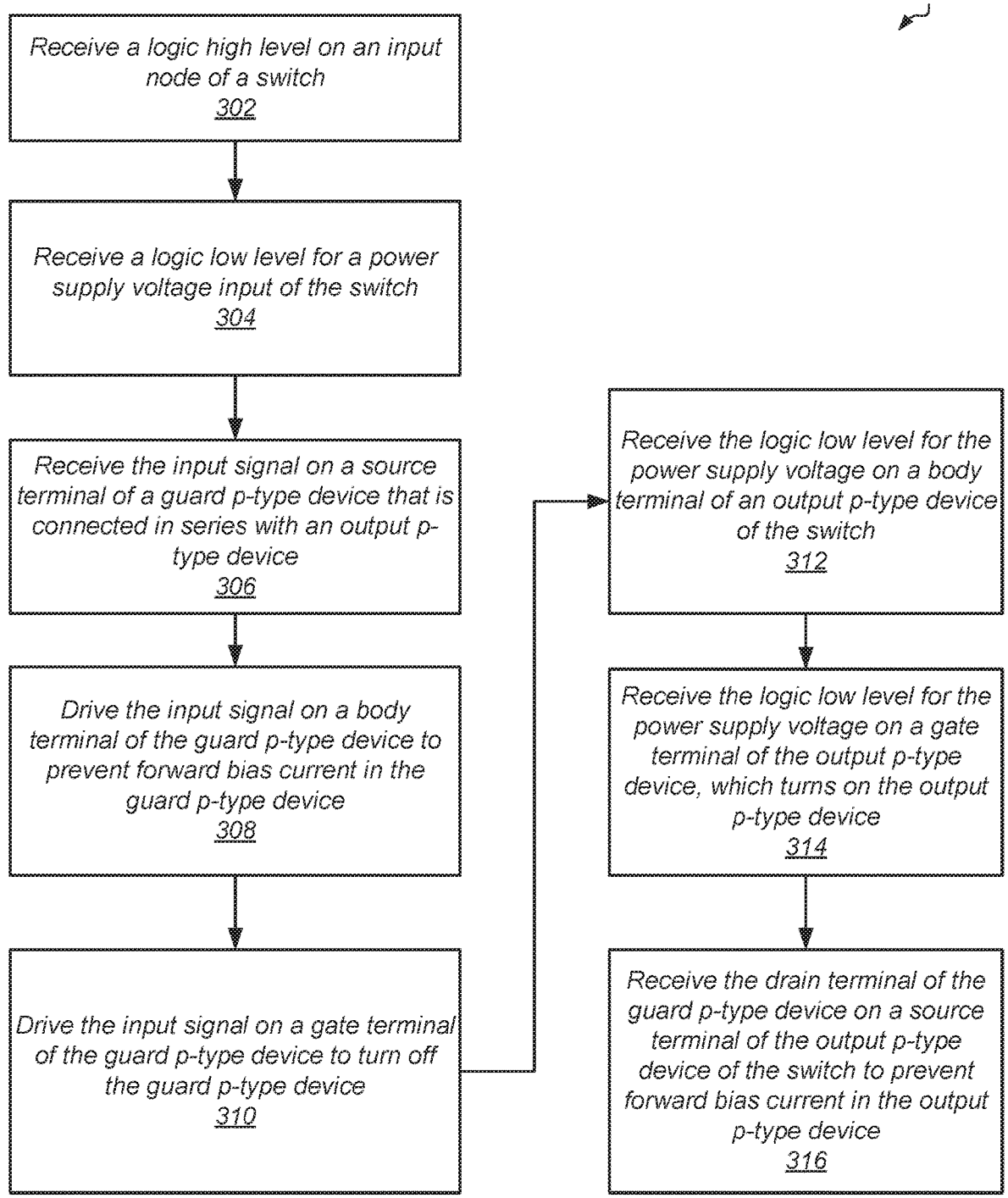
FIG. 3 is a flow diagram of one embodiment of a method for efficiently receiving analog input signals.
Figure 4:
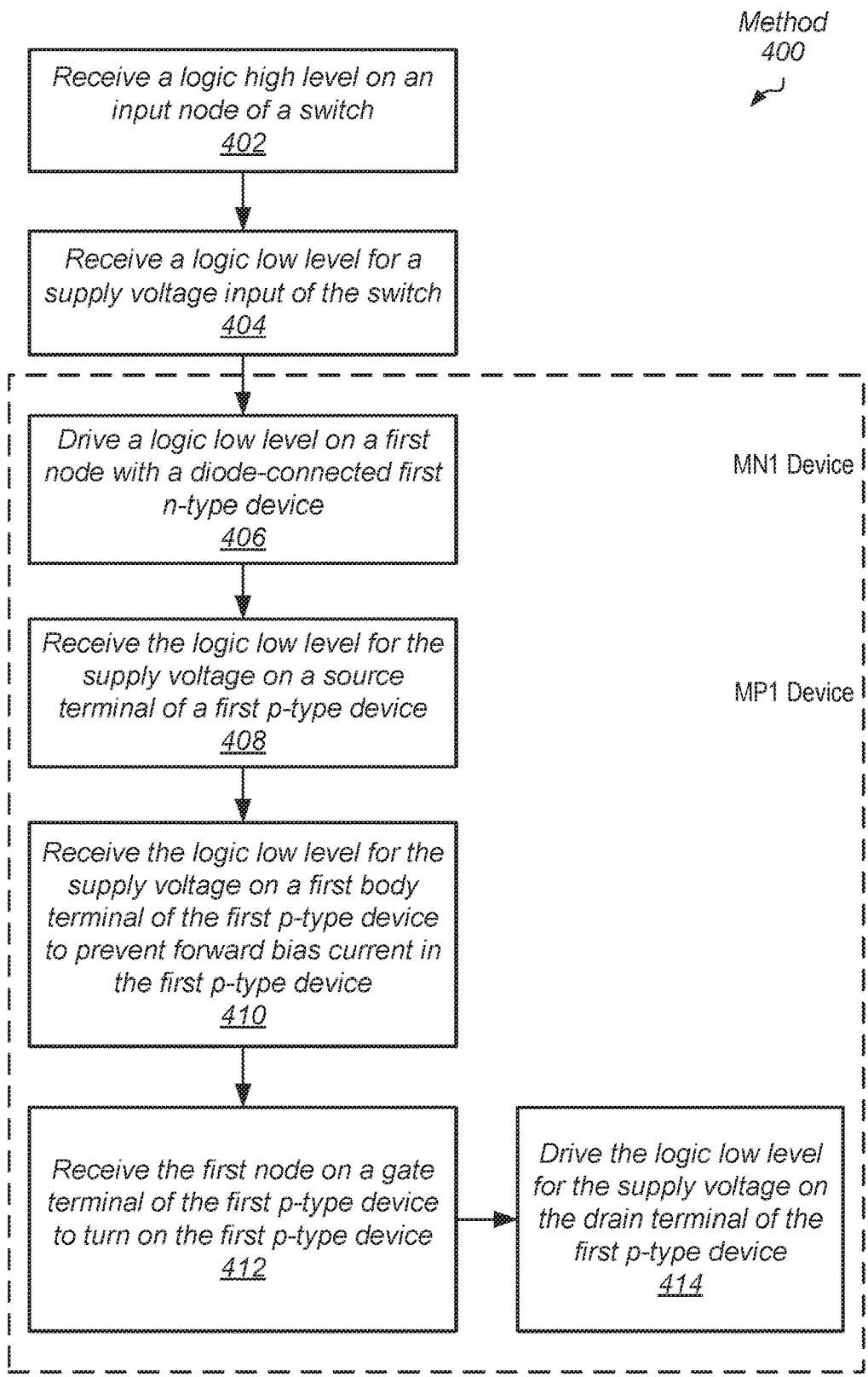
FIG. 4 is a flow diagram of one embodiment of a method for efficiently receiving analog input signals.
Figure 5:
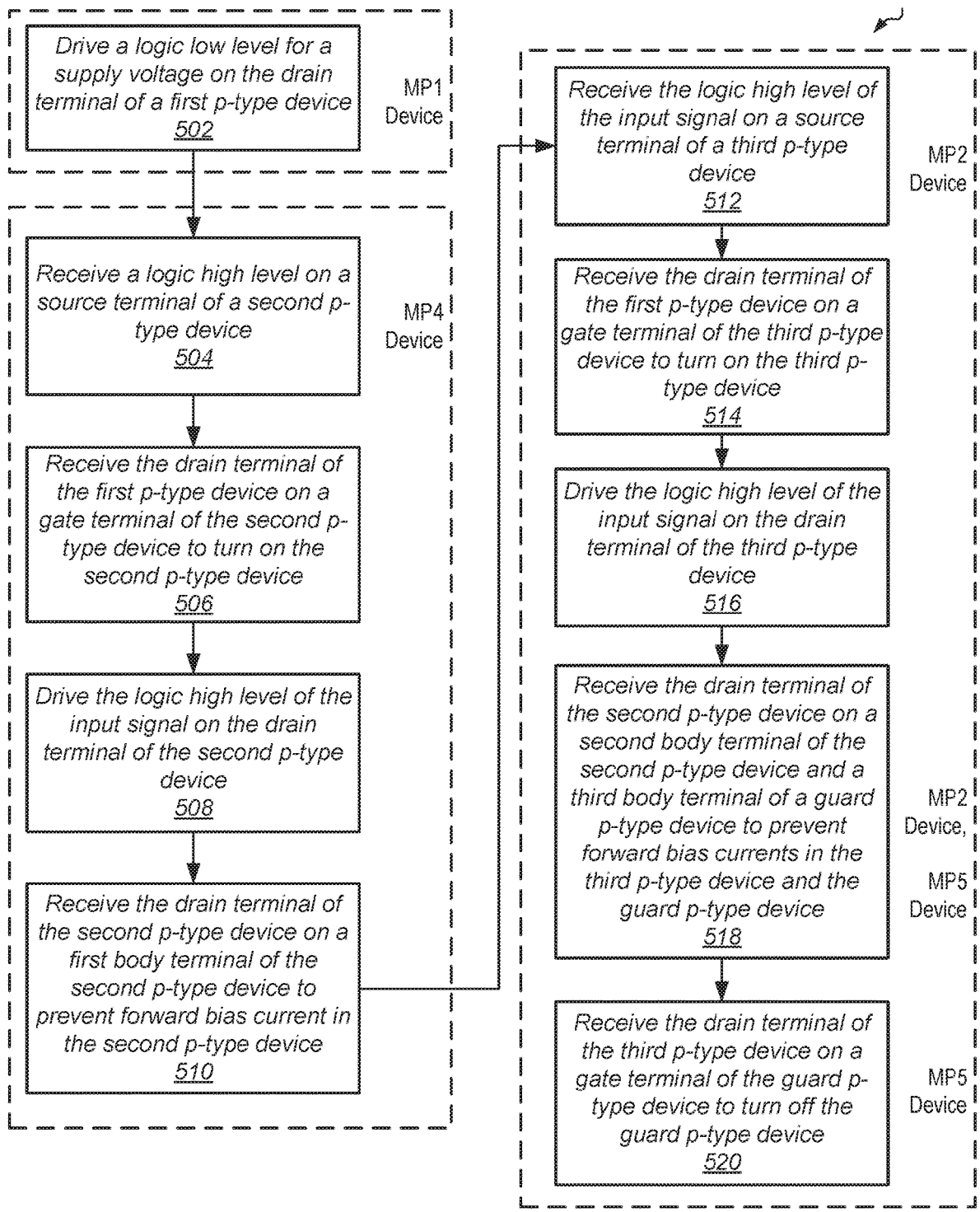
FIG. 5 is a flow diagram of one embodiment of a method for efficiently receiving analog input signals.
Figure 6:
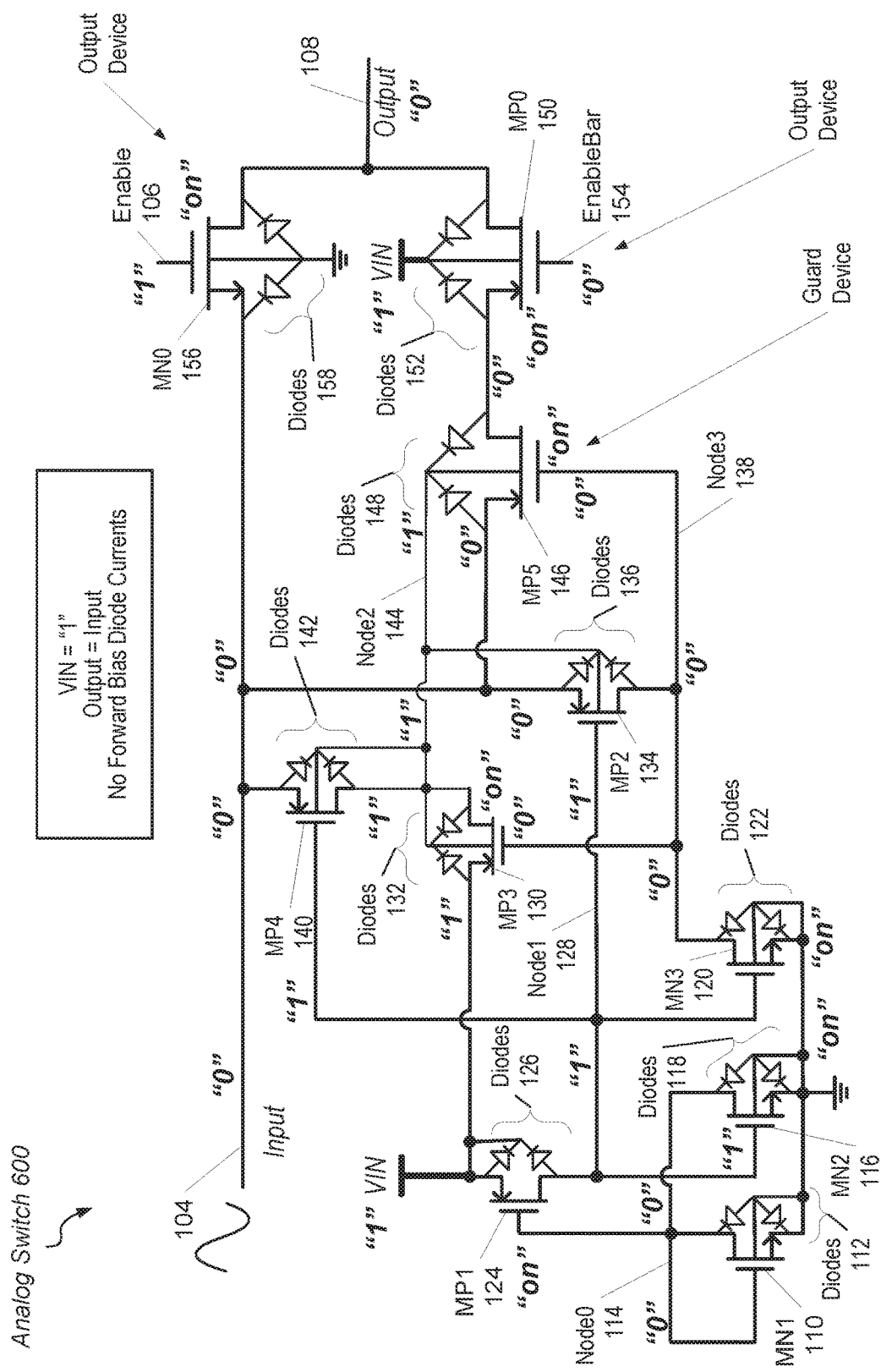
FIG. 6 is a block diagram of one embodiment of an analog input switch.

To prevent forward biasing of the parasitic diodes in other p-type devices of switch 100, the switch 100 uses other devices to control the level of the body terminals of the other p-type devices. For example, the switch 100 uses the other devices to drive the body terminals of the other p-type devices to a logic high level regardless of whether VIN is driven to a logic high level before the input signal 104. In the following description, FIG. 2 illustrates a case when the input signal 104 receives a logic high level while VIN remains at a logic low level. FIGS. 3-5 describe methods for efficiently receiving analog signals with switches by preventing parasitic diode currents from flowing. FIG. 6 illustrates a case when the input signal 104 receives a logic high level after VIN transitions to a logic high level.

Referring now to FIG. 2, a block diagram illustrating an embodiment of an analog switch 200 is shown. Logic and circuitry already described are numbered identically. In the illustrated embodiment, the nodes and device states in the switch 200 are shown during a case when the input signal 104 receives a logic high level while VIN remains at a logic low level. As shown, a logic high level is indicated by "1" and a logic low level is indicated by "0." As described earlier, the output p-type device 150 (MP0) is enabled while the output n-type device 156 (MN0) is disabled since each of the enable signal 106 and the enablebar signal 154 is at a logic low level.

The n-type device 110 (MN1) is connected as a diode-connected device with the gate terminal connected to the drain terminal. Therefore, as soon as n-type device 110 (MN1) is enabled, it operates in saturation mode and quickly discharges the node 114 (Node0). Therefore, besides any brief instances when electrostatic charge or another source provides any charge on the node 114 (Node0), the node 114 (Node0) remains discharged and at a logic low level. Accordingly, the p-type device 124 (MP1) is enabled, since its gate terminal receives the logic low level of the node 114 (Node0). Since VIN is at a logic low level, the p-type device 124 (MP1) drives a logic low level on its drain terminal and the node 128 (Node1). Accordingly, each of the n-type devices 116 (MN2) and 120 (MN3) are disabled due to receiving the logic low level on their gate terminals. In contrast, each of the p-type devices 134 (MP2) and 140 (MP4) is disabled due to receiving the logic low level on their gate terminals.

The enabled p-type device 134 (MP2) drives a logic high level on its drain terminal, which is connected to the node 138 (Node3). Accordingly, each of the p-type device 130 (MP3) and the guard p-type device 146 (MP5) are disabled due to receiving the logic high level on their gate terminals. The enabled p-type device 140 (MP4) drives a logic high level on its drain terminal, which is connected to the node 144 (Node2). Accordingly, the body terminals of each of the p-type device 130 (MP3), the p-type device 140 (MP4), the p-type device 134 (MP2) and the guard p-type device 146 (MP5) receives the logic high level. Therefore, there is no forward biasing of parasitic diodes for each of the p-type devices 130 (MP3), 140 (MP4), 134 (MP2) and 146 (MP5).

In addition, the disabled guard p-type device 146 (MP5) prevents a logic high level or a logic low level being driven on the source terminal of the output p-type device 150 (MP0), which prevents forward biasing of parasitic diodes 152. Therefore, despite the analog input signal 104 receives a logic high level while VIN remains at a logic low level, the switch 200 remains disabled as expected and no parasitic diodes are forward biased.

Turning now to FIG. 3, a generalized flow diagram of one embodiment of a method 300 for efficiently receiving analog input signals is shown. For purposes of discussion, the steps in this embodiment (as well as for FIGS. 4-5 and 7) are shown in sequential order. However, in other embodiments some steps may occur in a different order than shown, some steps may be performed concurrently, some steps may be combined with other steps, and some steps may be absent. The analog switch 100 may implement one or more of the steps of the methods 300-500 (of FIGS. 3-5) and method 700 (of FIG. 7).

In various embodiments, an analog switch receives an analog input signal, and when enabled, conveys the received input signal as an output analog signal. The analog switch also receives a power supply voltage (or power supply signal) as well as a ground reference voltage level. In an embodiment, the switch is enabled when the received enable signal is asserted. However, when the power supply voltage is at a logic low level, an output n-type device is disabled while an output p-type device is enabled based on each of the enable signal and its complement being at the logic low level. One or more devices in the switch receive a positive, non-zero input signal used to indicate the logic high level on the input node of the switch (block 302). One or more devices of the switch receive a ground reference voltage level for the power supply voltage input of the switch (block 304). The ground reference voltage level is used to indicate the logic low level. Therefore, the input signal arrived at the switch at the logic high level before the power supply voltage transitioned to the logic high level.

The switch receives the logic high level on a source terminal of a guard p-type device (block 306), which is connected in series with an output p-type device. The switch drives the logic high level on a body terminal of the guard p-type device to prevent forward bias current in the guard p-type device (block 308). The switch drives the logic high level on a gate terminal of the guard p-type device to turn off the guard p-type device (block 310). The switch receives the ground reference voltage level for the power supply voltage on a body terminal of an output p-type device of the switch (block 312).

The switch receives the logic low level for the power supply voltage on a gate terminal of the output p-type device to turn on the output p-type device (block 314). The switch receives the drain terminal of the guard p-type device on a source terminal of the output p-type device of the switch to prevent forward bias current in the output p-type device (block 316). Therefore, despite the analog input signal reaches a logic high level while the power supply voltage remains at a logic low level, the switch remains disabled as expected and no parasitic diodes are forward biased.

Turning now to FIG. 4, a generalized flow diagram of one embodiment of a method 400 for efficiently receiving analog input signals is shown. In various embodiments, an analog switch receives an analog input signal, and when enabled, conveys the received input signal as an analog output signal. The analog switch also receives a power supply voltage (or power supply signal) as well as a ground reference voltage level. In an embodiment, the switch is enabled when the received enable signal is asserted. However, when the power supply voltage is at a logic low level, an output n-type device is disabled while an output p-type device is enabled based on each of the enable signal and its complement being at the logic low level. The switch receives a positive, non-zero input signal (i.e., a logic high level) on an input node (block 402). The switch receives a ground reference voltage level (i.e., a logic low level) for a supply voltage input (block 404). Therefore, the input signal arrived at the switch with a positive, non-zero voltage level before the power supply voltage transitioned to a targeted positive, non-zero voltage level where the positive, non-zero voltage level will be used to indicate the logic high level.

In some embodiments, the following blocks 406-414 correspond to device 110 (MN1) and device 124 (MP1) (of FIG. 1). A diode-connected first n-type device of the switch drives a logic low level, such as a ground reference voltage level, on a first node (block 406). A source terminal of a first p-type device receives the logic low level used for the power supply voltage (block 408). A first body terminal of the first p-type device receives the ground reference voltage level for the power supply voltage to prevent forward bias current in the first p-type device (block 410). A gate terminal of the first p-type device receives the logic low level, such as the ground reference voltage level, on the first node to turn on the first p-type device (block 412).

The enabled first p-type device drives the logic low level, such as the ground reference voltage level for the power supply voltage, on the drain terminal of the first p-type device (block 414). The logic low level on the drain terminal of the first p-type device is later used to enable other devices to drive a logic high level on the body terminals of the guard p-type device and other p-type devices in the switch. When the body terminals are driven to a logic high level, the parasitic diodes are incapable of being forward biased.

Turning now to FIG. 5, a generalized flow diagram of one embodiment of a method 500 for efficiently receiving analog input signals is shown. In various embodiments, an analog switch receives an analog input signal, and when enabled, conveys the received input signal as an output analog signal. The analog switch also receives a power supply voltage (or signal) as well as a ground reference voltage level. In an embodiment, the switch is enabled when the received enable signal is asserted. However, when the power supply voltage is at a logic low level, an output n-type device is disabled while an output p-type device is enabled based on each of the enable signal and its complement being at the logic low level. In some embodiments, the following blocks 502-520 correspond to device 124 (MP1), device 134 (MP2), device 140 (MP4), and device 146 (MP5) (of FIG. 1).

The switch receives a positive, non-zero input signal on an input node. The switch receives a ground reference voltage level for a supply voltage input. Therefore, the input signal arrived at the switch before the power supply voltage transitioned to a targeted positive, non-zero value. The switch drives a logic low level, such as a ground reference voltage level for a supply voltage, on the drain terminal of a first p-type device (block 502). A source terminal of a second p-type device receives a logic high level, such as the positive, non-zero input signal (block 504). A second p-type device turns on by receiving on its gate terminal the drain terminal of the first p-type device (block 506).

The enabled second p-type device drives a logic high level, such as the positive, non-zero input signal on its source terminal, on the drain terminal of the second p-type device (block 508). A first body terminal of the second p-type device receives the drain terminal of the second p-type device to prevent forward bias current in the second p-type device (block 510). A source terminal of a third p-type device receives a logic high level such as the positive, non-zero input signal (block 512). To turn on the third p-type device, a gate terminal of the third p-type device receives the drain terminal of the first p-type device (block 514). The enabled third p-type device drives the positive, non-zero input signal on the drain terminal of the third p-type device (block 516).

To prevent forward bias currents in the third p-type device and a guard p-type device connected in series with the output p-type device, each of a second body terminal of the second p-type device and a third body terminal of a guard p-type device receives the drain terminal of the second p-type device (block 518). To turn off the guard p-type device, a gate terminal of the guard p-type device receives the drain terminal of the third p-type device (block 520). Therefore, the guard p-type device prevents driving a logic high level or a logic low level on the source terminal of the series-connected output p-type device. Although the output p-type device is enabled, it does not have a logic high level or a logic low level to drive on its drain terminal. The switch is disabled, since the power supply remains at the logic low level, and therefore, the output p-type device should not be driving a value on the output of the switch.

Referring now to FIG. 6, a block diagram illustrating an embodiment of an analog switch 600 is shown. Logic and circuitry already described are numbered identically. In the illustrated embodiment, the nodes and device states in the switch 600 are shown during a case when the input signal 104 receives a logic low level after VIN transitions to a logic high level. As described earlier, a logic high level is indicated by "1" and a logic low level is indicated by "0." In this case, each of the output n-type device 156 (MN0) and the output p-type device 150 (MP0) is enabled, since the enable signal 106 is at a logic high level and the enablebar signal 154 is at a logic low level.

As described earlier, the n-type device 110 (MN1) is connected as a diode-connected device with the gate terminal connected to the drain terminal. Therefore, as soon as n-type device 110 (MN1) is enabled, it operates in saturation mode and quickly discharges the node 114 (Node0). Therefore, besides any brief instances when electrostatic charge or another source provides any charge on the node 114 (Node0), the node 114 (Node0) remains discharged and at a logic low level. Accordingly, the p-type device 124 (MP1) is enabled, since its gate terminal receives the logic low level of the node 114 (Node0). Since VIN is at a logic high level, the p-type device 124 (MP1) drives a logic high level on its drain terminal and the node 128 (Node1). Accordingly, each of the n-type devices 116 (MN2) and 120 (MN3) are enabled due to receiving the logic high level on their gate terminals. In contrast, each of the p-type devices 134 (MP2) and 140 (MP4) is disabled due to receiving the logic high level on their gate terminals.

The enabled n-type device 116 (MN2) further discharges the node 114 (Node0) in addition to the diode-connected n-type device 110 (MN1). The enabled n-type device 120 (MN3) discharges the node 138 (Node3), and thereby, drives a logic low level on this node. Accordingly, each of the p-type device 130 (MP3) and the guard p-type device 146 (MP5) is enabled due to receiving the logic low level on their gate terminals. The enabled p-type device 130 (MP3) receives VIN on its source terminal, which is at the logic high level. Therefore, the enabled p-type device 130 (MP3) drives a logic high level on its drain terminal, which is connected to node 144 (Node2). Accordingly, the body terminals of each of the p-type device 130 (MP3), the p-type device 140 (MP4), the p-type device 134 (MP2) and the guard p-type device 146 (MP5) receives the logic high level. Therefore, there is no forward biasing of parasitic diodes for each of the p-type devices 130 (MP3), 140 (MP4), 134 (MP2) and 146 (MP5).

The enabled guard p-type device 146 (MP5) drives the logic low level on its source terminal to its drain terminal, which is connected to the source terminal of the output p-type device 150 (MP0). The enabled output p-type device 150 (MP0) drives the logic low level to its drain terminal, which is connected to the output of the switch 100 and the output signal 108 is at a logic low level. In a similar manner, the enabled output n-type device 156 (MN0) also receives the input signal 104 on its source terminal and drives the logic low level to its drain terminal, which is connected to the output of the switch 100 and the output signal 108 is at a logic low level. Therefore, even when the voltage supply VIN is updated before the analog input signal 104 transitions, the switch 600 is capable of remaining enabled as expected and no parasitic diodes are forward biased.

Figure 7:
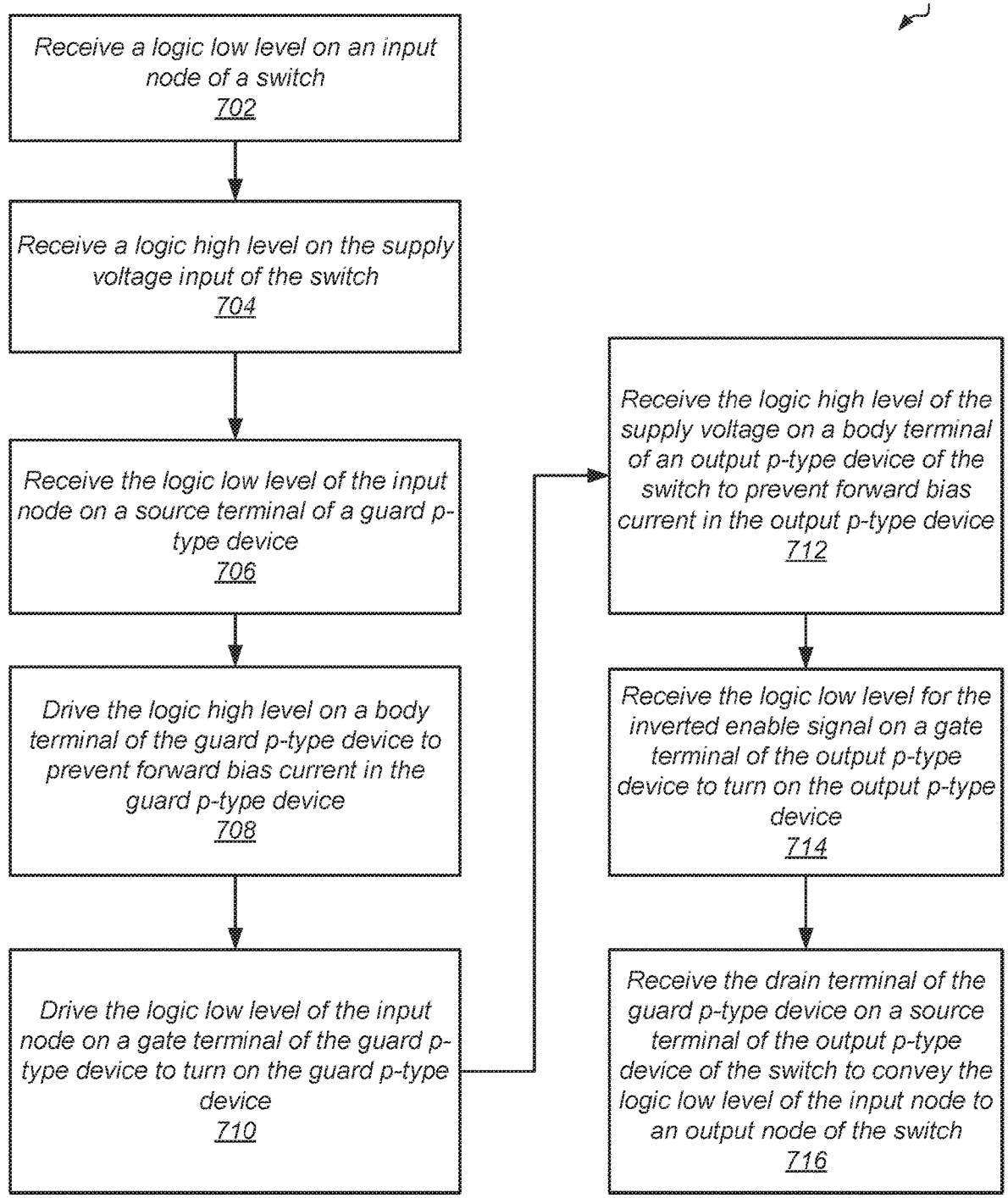
FIG. 7 is a flow diagram of one embodiment of a method for efficiently receiving analog input signals.

Turning now to FIG. 7, a generalized flow diagram of one embodiment of a method 700 for efficiently receiving analog input signals is shown. In various embodiments, an analog switch receives an analog input signal, and when enabled, conveys the received input signal as an output analog signal. The analog switch also receives a power supply voltage (or signal) as well as a ground reference voltage level. In an embodiment, the switch is enabled when the received enable signal is asserted. The switch receives a logic low level, such as a ground reference voltage level, on an input node (block 702). The switch receives a logic high level, such as a positive, non-zero value greater than a transistor threshold, for the power supply voltage (block 704).

A source terminal of a guard p-type device receives the ground reference voltage level of the input node (block 706). In various embodiments, the guard p-type device is serially connected to an output p-type device of the switch. To prevent forward bias current in the guard p-type device, another device in the switch drives a logic high level, such as the positive, non-zero supply voltage, on a first body terminal of the guard p-type device (block 708). To turn on the guard p-type device, another device in the switch drives a logic low level, such as the ground reference voltage level of the input node, on a gate terminal of the guard p-type device (block 710).

To prevent forward bias current in the output p-type device, a second body terminal different from the first body terminal of an output p-type device receives a logic high level such as the positive, non-zero supply voltage (block 712). To turn on the output p-type device, a gate terminal of the output p-type device receives a logic low level such as an inverted Boolean value of the enable signal (block 714). To convey the ground reference voltage level of the input node to an output node of the switch, a source terminal of the output p-type device of the switch receives the drain terminal of the guard p-type device (block 716). Therefore, the enabled output p-type device conveys the logic low level on the output of the switch in addition to the enabled output n-type device. In addition, no forward bias currents flow through parasitic diodes of the devices in the switch.

Figure 8:
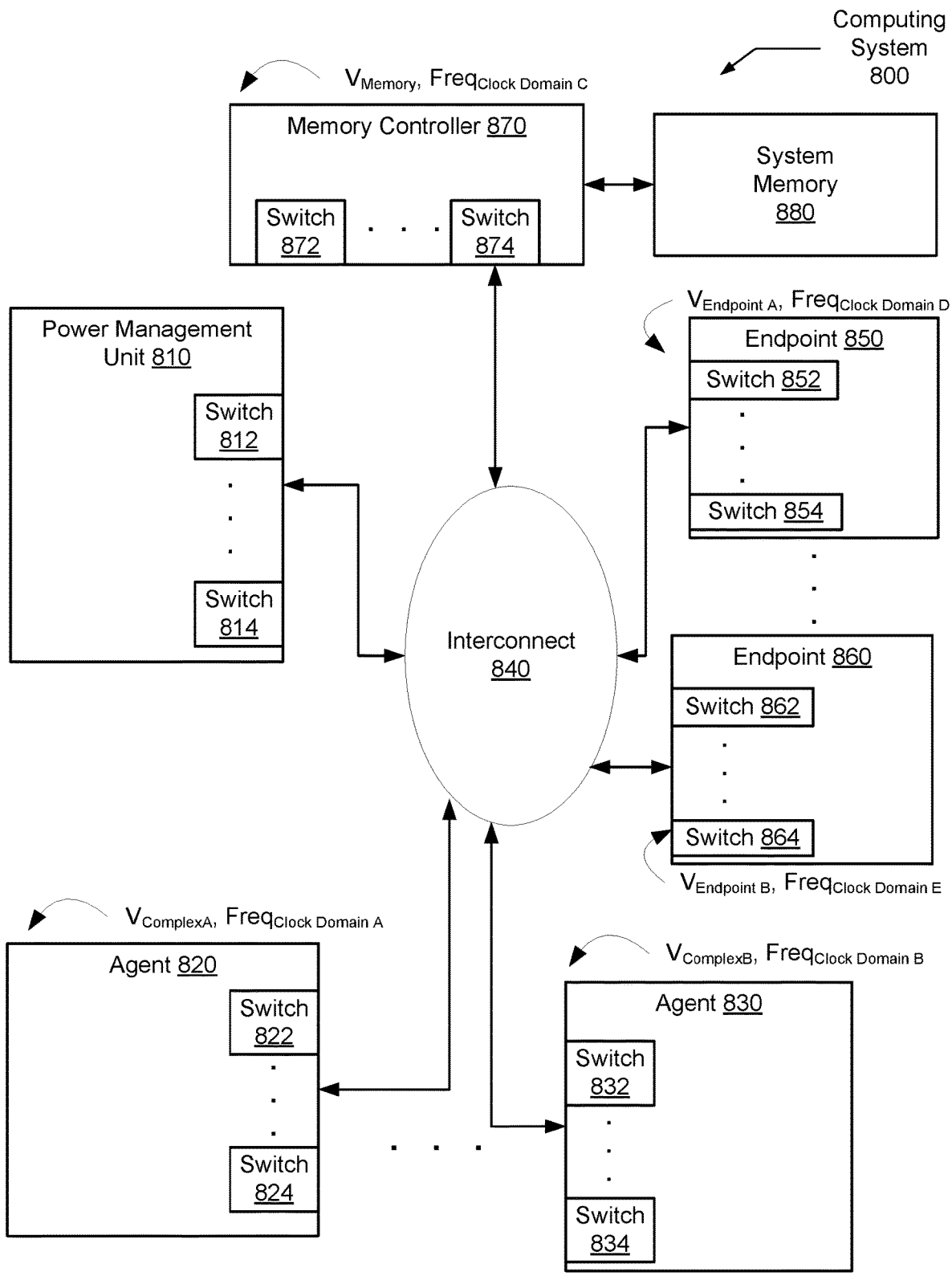
FIG. 8 is a block diagram of one embodiment of a computing system.

Referring to FIG. 8, a generalized block diagram of one embodiment of a computing system 800 is shown. In the illustrated embodiment, the interconnect 840 routes messages, transactions and data among the power management unit 810, agents 820-830, endpoints 840-850 and memory controller 870. In some embodiments, the interconnect 840 is a communication fabric (or fabric). In various embodiments, the computing system 800 is a system on a chip (SoC) that includes multiple types of integrated circuits on a single semiconductor die, each integrated circuit providing a separate functionality. In some embodiments, computing system 800 is also referred to as an application specific integrated circuit (ASIC), or an apparatus. In other embodiments, the agents 820-830 and endpoints 850-860 are individual dies within a package such as a multi-chip module (MCM). In yet other embodiments, the agents 820-830, endpoints 850-860, the power management unit 810 and the memory controller 870 are individual dies or chips on a printed circuit board.

Clock sources, such as phase lock loops (PLLs), interrupt controllers, and so forth are not shown in FIG. 8 for ease of illustration. It is also noted that the number of components of the computing system 800 vary from embodiment to embodiment. In other embodiments, there are more or fewer of each component than the number shown for the computing system 800. Examples of the agents 810 and 820 include one or more of multimedia engines, digital signal processors (DSPs) and processing units, each with one or more of a central processing unit (CPU) and a data parallel processor like a graphics processing unit (GPU). For example, processors in the agents 810 and 820 include one or more general-purpose cores of the CPU, one or more single instruction multiple data (SIMD) cores of the GPU and/or a field programmable gate array (FPGA), and so on.

In some embodiments, each of the agents 820-830 is a processor complex. The term "processor complex" is used to denote a configuration of one or more processor cores using local storage (not shown), such as a local shared cache memory subsystem, and capable of processing a workload together. For example, in an embodiment, the workload includes one or more programs comprising instructions executed by a processor. Any instruction set architecture is implemented for the computing system 800 in various embodiments.

In some embodiments, components within agent 820 are similar to components in agent 810. In other embodiments, components in agent 820 are designed for lower power consumption, and therefore, include control logic and processing capability producing less performance. In such embodiments, supported clock frequencies are less than supported clock frequencies in agent 810. In addition, one or more of the processor cores in agent 820 include a smaller number of execution pipelines and/or functional blocks for processing relatively high power consuming instructions than what is supported by the processor cores in agent 810.

In various embodiments, agents 820-830 and endpoints 850-860 transfer commands and data to one another and to the power management unit 810 and the memory controller 870 through the interconnect 840. In some embodiments, the interconnect 840 includes multiple levels of fabric multiplexers (or muxes). In such embodiments, agents 820-830, endpoints 850-860, the power management unit 810 and the memory controller 870 include fabric interface units. Different types of messages, transactions and data flow independently through the fabric. In some embodiments, a communication fabric utilizes a single physical fabric bus to include a number of overlaying virtual channels, or dedicated source and destination buffers, each carrying a different type of traffic. Each channel is independently flow controlled with no dependence between transactions in different channels. In other embodiments, the communication fabric is packet-based, and may be hierarchical with bridges, cross bar, point-to-point, or other interconnects.

In various embodiments, the interconnect 840 uses one or more bus protocols for transferring commands and data, enforcing an order between transactions with particular transaction types, and ensuring cache coherence among the different agents 820-830, endpoints 850-860 and the memory controller 870. The supported communication protocols determine allowable transfer sizes, supported burst transfer sizes, supported directions for simultaneous transfers, allowable number of outstanding requests while sending more requests, support of out-of-order completions, supported clock domains, supported interrupt mechanisms, and so forth.

Endpoints 850-860 are representative of any number and type of components coupled to interconnect 830. For example, in some embodiments, endpoints 850-860 include one or more cameras, flash controllers, display controllers, media controllers, graphics units, communication interfaces such as radio communication interfaces, and/or other devices. Endpoints 850-860 are also representative of any number of input/output (I/O) interfaces or devices and provide interfaces to any type of peripheral device implementing any hardware functionality included in computing system 800. For example, in an embodiment, any of the endpoints 850-860 connect to audio peripherals such as microphones, speakers, interfaces to microphones and speakers, audio processors, digital signal processors, mixers, etc. Other I/O devices include interface controllers for various interfaces external to computing system 800, including interfaces such as Universal Serial Bus (USB), peripheral component interconnect (PCI) including PCI Express (PCIe), serial and parallel ports, general-purpose I/O (GPIO), a universal asynchronous receiver/transmitter (uART), a FireWire interface, an Ethernet interface, an analog-to-digital converter (ADC), a digital-to-analog converter (DAC), and so forth. Other I/O devices include networking peripherals such as media access controllers (MACs).

In yet other embodiments, one or more of endpoints 850-860 include memory controllers for interfacing with system memory or separate memory such as a portable flash memory device. As shown, memory controller 870 is used to interface with system memory 880. Memory controller 870 includes any number of memory ports, generates proper clocking to memory devices, and interfaces to system memory 880. System memory 880 includes one of a variety of types of or more of dynamic random access memory (DRAM). In various embodiments, one or more of agents 820-830, endpoints 850-860, and the memory controller 870 use switches in interface logic. For example, the agent 820 uses the switches 822-824 to receive commands and data from other components in the computing system 800. Similarly, the agent 830 uses the switches 832-834. Endpoint 850 uses switches 854-856, endpoint 860 uses switches 862-864, the power management unit 810 uses switches 812-814, and the memory controller 870 uses switches 872-874. In various embodiments, the functionality of the switches 812-874 is equivalent to the switches 100, 200 and 600 (of FIGS. 1, 2 and 6).

In various embodiments, the power management unit 810 controls the power supply voltage magnitudes and operational clock frequencies for the agents 820-830, endpoints 840-850 and memory controller 870. In the illustrated embodiment, there is a supply voltage indicated as $V_{Complex}$ for each of the agents 820-830, a supply voltage indicated as $V_{Endpoint}$ for each of the endpoints 840-850, and a supply voltage indicated as $V_{Memory}$ for the memory controller 870. In addition, there is a clock frequency $Freq_{Clock\ Domain}$ from a particular clock domain for each of the agents 820-830, endpoints 840-850 and memory controller 870. In some embodiments, there may be multiple supply voltages for other components of the computing system 800 not shown. In various embodiments, each of the agents 820-830, endpoints 840-850 and memory controller 870 is capable of operating with a different supply voltage from a different power plane. In other embodiments, one or more of the agents 820-830, endpoints 840-850 and memory controller 870 operate with a same supply voltage from a single power plane while also operating with different clock frequencies from different clock domains.

Figure 9:
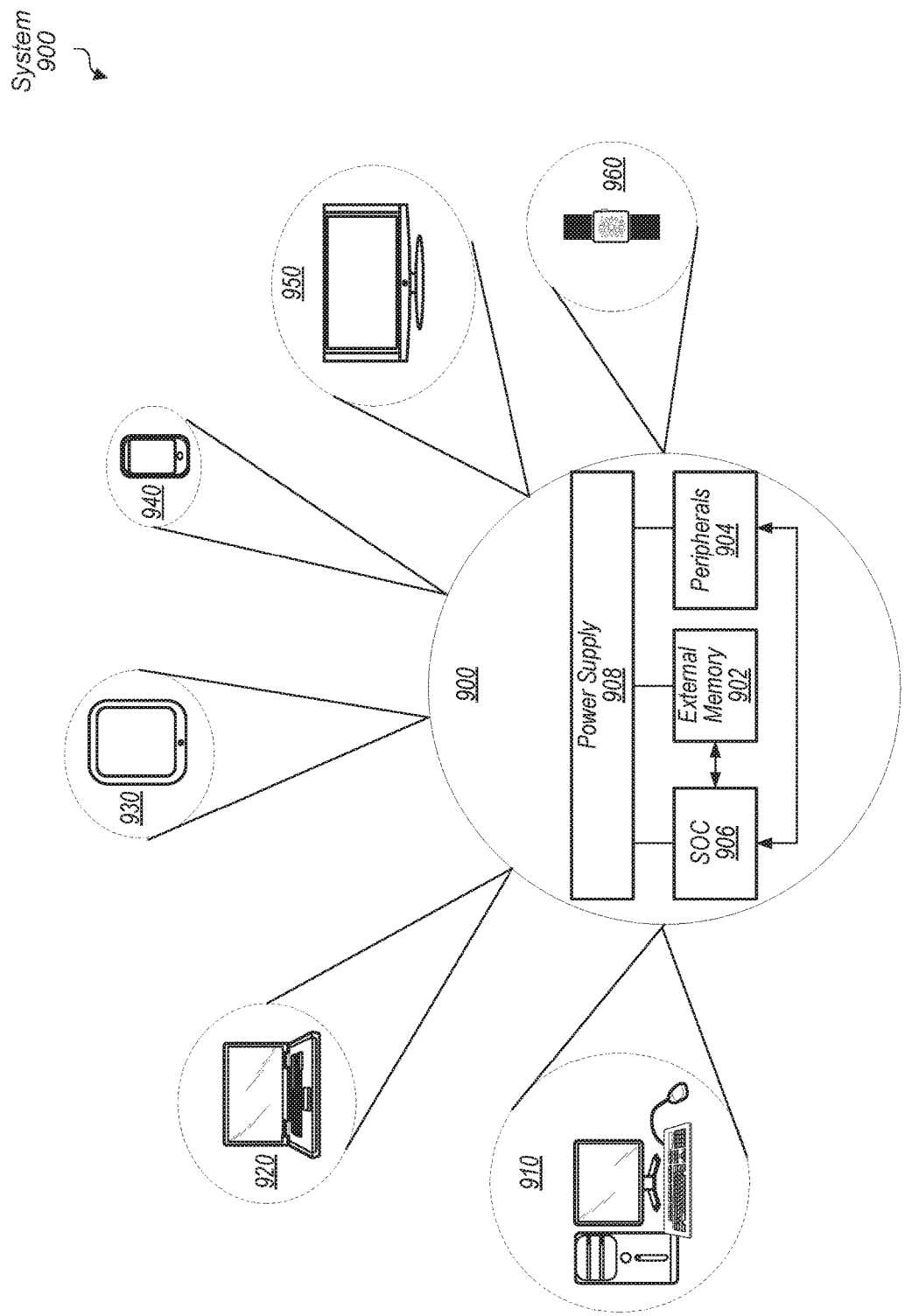
FIG. 9 is a block diagram of one embodiment of a system.

Turning next to FIG. 9, a block diagram of one embodiment of a system 900 is shown. As shown, system 900 represents chip, circuitry, components, etc., of a desktop computer 910, laptop computer 920, tablet computer 930, cell or mobile phone 940, television 950 (or set top box coupled to a television), wrist watch or other wearable item 960, or otherwise. Other devices are possible and are contemplated. In the illustrated embodiment, the system 900 includes at least one instance of a system on chip (SoC) 906, which includes multiple processors and a communication fabric. In some embodiments, the SoC 906 includes a computing system such as computing system 800 (of FIG. 8), which uses switches such as switch 100 (of FIG. 1). In various embodiments, SoC 906 is coupled to external memory 902, peripherals 904, and power supply 908.

The power supply 908 provides the power supply voltages to SoC 906 as well as one or more power supply voltages to the memory 902 and/or the peripherals 904. In various embodiments, power supply 908 represents a battery (e.g., a rechargeable battery in a smart phone, laptop or tablet computer). In some embodiments, more than one instance of SoC 906 is included (and more than one external memory 902 is included as well).

The memory 902 is any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices are coupled onto a circuit board to form memory modules such as single inline memory modules (SIMMs), dual inline memory modules (DIMMs), etc. Alternatively, the devices are mounted with a SoC or an integrated circuit in a chip-on-chip configuration, a package-on-package configuration, or a multi-chip module configuration.

The peripherals 904 include any desired circuitry, depending on the type of system 900. For example, in one embodiment, peripherals 904 includes devices for various types of wireless communication, such as Wi-Fi, Bluetooth, cellular, global positioning system, etc. In some embodiments, the peripherals 904 also include additional storage, including RAM storage, solid-state storage, or disk storage. The peripherals 904 include user interface devices such as a display screen, including touch display screens or multi-touch display screens, keyboard or other input devices, microphones, speakers, etc.

In various embodiments, program instructions of a software application may be used to implement the methods and/or mechanisms previously described. The program instructions describe the behavior of hardware in a high-level programming language, such as C. Alternatively, a hardware design language (HDL) is used, such as Verilog. The program instructions are stored on a non-transitory computer readable storage medium. Numerous types of storage media are available. The storage medium is accessible by a computer during use to provide the program instructions and accompanying data to the computer for program execution. In some embodiments, a synthesis tool reads the program instructions in order to produce a netlist including a list of gates from a synthesis library.

It should be emphasized that the above-described embodiments are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. An apparatus comprising:
   output circuitry configured to:
      receive an inverted value of an enable signal on a gate terminal of an output p-type device, responsive to a power supply signal having a logic high level;
      receive a value equal to that of the enable signal on the gate terminal of the output p-type device, responsive to both the enable signal and the power supply signal having the logic low level; and
      receive the power supply signal on a body terminal of the output p-type device; and
   control circuitry configured to:
      receive the power supply signal; and
      in response to determining the power supply signal has the logic low level, prevent driving a logic high level or a logic low level on a source terminal of the output p-type device.

2. The apparatus as recited in claim 1, wherein,
   the output circuitry is further configured to receive a drain terminal of a guard p-type device on a source terminal of the output p-type device; and
   the control circuitry is further configured to receive an input signal on a source terminal of the guard p-type device.

3. The apparatus as recited in claim 2, wherein the control circuitry is further configured to generate the input signal on a body terminal of the guard p-type device, responsive to determining the power supply signal has a logic low level.

4. The apparatus as recited in claim 2, wherein the control circuitry is further configured to generate the power supply signal on a body terminal of the guard p-type device, responsive to determining the power supply signal has a logic high level.

5. The apparatus as recited in claim 2, wherein the control circuitry is further configured to generate the input signal on a gate terminal of the guard p-type device, responsive to determining the power supply signal has a logic low level.

6. The apparatus as recited in claim 2, wherein the control circuitry is further configured to generate a logic low level on a gate terminal of the guard p-type device, responsive to determining the power supply signal has a logic high level.

7. The apparatus as recited in claim 3, wherein the control circuitry is further configured to:
   receive, on a gate terminal of a first p-type device, each of a gate terminal and a drain terminal of a first n-type device;
   receive the power supply signal on a source terminal of the first p-type device; and drive the power supply signal on a drain terminal of the first p-type device to a gate terminal of each of a second p-type device and a third p-type device.

8. The apparatus as recited in claim 7, wherein in response to determining the power supply signal has a logic low level, the control circuitry is further configured to:
convey the input signal to the body terminal of the guard p-type device through a source terminal and a drain terminal of the second p-type device; and
convey the input signal to the gate terminal of the guard p-type device through a source terminal and a drain terminal of the third p-type device.

9. The apparatus as recited in claim 7, wherein in response to determining the power supply signal has a logic high level, the control circuitry is further configured to:
drive the power supply signal on the drain terminal of the first p-type device to a gate terminal of each of a first n-type device;
convey a logic low level to a gate terminal of each of a fourth p-type device and the guard p-type device through a source terminal and a drain terminal of the first n-type device; and
convey the power supply signal to the body terminal of the guard p-type device through a source terminal and a drain terminal of the fourth p-type device.

10. A method for driving an input signal as an output signal comprising:
receiving, by output circuitry of a switch, an inverted value of an enable signal on a gate terminal of an output p-type device, to a power supply signal having a logic high level;
receiving, by the output circuitry, a value equal to that of the enable signal on the gate terminal of the output p-type device, responsive to both the enable signal and the power supply signal having the logic low level;
receiving, by the output circuitry, the power supply signal on a body terminal of the output p-type device;
receiving, by control circuitry of the switch, the power supply signal; and
in response to determining the power supply signal has the logic low level, prevent driving, by the control circuitry, a logic high level or a logic low level on a source terminal of the output p-type device.

11. The method as recited in claim 10, further comprising:
receiving a drain terminal of a guard p-type device on a source terminal of the output p-type device; and
receiving the input signal on a source terminal of the guard p-type device.

12. The method as recited in claim 11, further comprising generating the input signal on a body terminal of the guard p-type device, responsive to determining the power supply signal has a logic low level.

13. The method as recited in claim 11, further comprising generating the power supply signal on a body terminal of the guard p-type device, responsive to determining the power supply signal has a logic high level.

14. The method as recited in claim 11, further comprising generating the input signal on a gate terminal of the guard p-type device, responsive to determining the power supply signal has a logic low level.

15. The method as recited in claim 11, further comprising generating a logic low level on a gate terminal of the guard p-type device, responsive to determining the power supply signal has a logic high level.

16. An interface comprising:
a plurality of switches;
input logic configured to receive data from one or more of the plurality of switches; and
wherein at least a given switch of the plurality of switches is configured to:
receive a power supply signal;
receive an inverted value of an enable signal on a gate terminal of an output p-type device, responsive to the power supply signal having a logic high level;
receive a value equal to that of the enable signal on the gate terminal of the output p-type device, responsive to both the enable signal and the power supply signal having the logic low level;
receive the power supply signal on a body terminal of the output p-type device; and
in response to determining the power supply signal has the logic low level, prevent driving a logic high level or a logic low level on a source terminal of the output p-type device.

17. The interface as recited in claim 16, wherein the given switch is further configured to:
receive a drain terminal of a guard p-type device on a source terminal of the output p-type device; and
receive an input signal on a source terminal of the guard p-type device.

18. The interface as recited in claim 17, wherein the given switch is further configured to generate the input signal on a body terminal of the guard p-type device, responsive to determining the power supply signal has a logic low level.

19. The interface as recited in claim 17, wherein the given switch is further configured to generate the power supply signal on a body terminal of the guard p-type device, responsive to determining the power supply signal has a logic high level.

20. The interface as recited in claim 17, wherein the given switch is further configured to generate the input signal on a gate terminal of the guard p-type device, responsive to determining the power supply signal has a logic low level.

* * * * *